US012757760B2

(12) United States Patent
Nad et al.

(10) Patent No.: US 12,757,760 B2
(45) Date of Patent: Oct. 6, 2026

(54) ASYMMETRICAL DIELECTRIC-TO-METAL ADHESION ARCHITECTURE FOR ELECTRONIC PACKAGES

(71) Applicant: Intel Corporation, Santa Clara, CA (US)

(72) Inventors: Suddhasattwa Nad, Chandler, AZ (US); Yi Yang, Gilbert, AZ (US); Jason Steill, Phoenix, AZ (US); Jieying Kong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 266 days.

(21) Appl. No.: 17/848,053

(22) Filed: Jun. 23, 2022

(65) Prior Publication Data

US 2023/0420353 A1 Dec. 28, 2023

(51) Int. Cl.

*H10W 70/65* (2026.01)
*H10W 70/05* (2026.01)
*H10W 70/685* (2026.01)
*H10W 70/69* (2026.01)
*H10W 90/00* (2026.01)

(52) U.S. Cl.

CPC ........... *H10W 70/65* (2026.01); *H10W 70/05* (2026.01); *H10W 70/095* (2026.01); *H10W 70/097* (2026.01); *H10W 70/685* (2026.01); *H10W 70/69* (2026.01); *H10W 90/701* (2026.01); *H10W 90/724* (2026.01)

(58) Field of Classification Search

CPC ............ H01L 21/4857; H10W 90/701; H10W 70/685; H10W 70/65; H10W 70/05; H10W 70/095; H10W 70/097; H10W 70/69; H10W 90/724; H10W 72/072; H10W 72/20

See application file for complete search history.

(56) References Cited

U.S. PATENT DOCUMENTS 8,863,377 B2 * 10/2014 Harazono ............ H05K 3/4644 29/830
2017/0372991 A1 * 12/2017 Tsukamoto ......... H10W 70/685
2018/0166372 A1 * 6/2018 Shimizu .............. H10W 70/685
2019/0035719 A1 * 1/2019 Daitoku .................. G06F 3/041
2019/0363063 A1 * 11/2019 May ...................... H10W 20/40
2019/0385966 A1 * 12/2019 Gao ....................... H10W 20/20
2022/0077046 A1 * 3/2022 Adachi ............... H10W 70/685
2023/0145610 A1 * 5/2023 Chen ................... H10W 70/614 257/692
2023/0345622 A1 * 10/2023 Chang .................. H05K 1/0242

* cited by examiner

*Primary Examiner* — Christine S. Kim
*Assistant Examiner* — Andrew Victor Postor
(74) *Attorney, Agent, or Firm* — Essential Patents Group, LLP

(57) ABSTRACT

An electronic device package comprises a substrate with a first side and a second side opposite the first side; a first conductive feature on the first side and having a first surface; a first dielectric material in contact with the first surface, wherein the first dielectric material has a first composition comprising silicon and nitrogen; a second conductive feature on the second side of the substrate and having a second surface; and a second dielectric material in contact with the second surface, wherein the second dielectric material has a second composition different than the first composition, and wherein a surface roughness of the second surface is greater than a surface roughness of the first surface.

25 Claims, 8 Drawing Sheets

100

ASYMMETRICAL DIELECTRIC-TO-METAL ADHESION ARCHITECTURE FOR ELECTRONIC PACKAGES

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like. These integrated circuit devices and packages generally include at least one integrated circuit die, such as a silicon die having integrated circuitry formed therein, that may be physically and electrically attached to an electronic substrate, such that conductive routes in the electronic substrate appropriately routes electrical signals to and from the integrated circuitry of the integrated circuit device(s). The electronic substrates are formed of layers of dielectric material embedded with electrical conductors. Without some sort of adhesion treatment to maintain the electrical conductors tightly against the dielectric layers, delamination occurs such that damaging materials used for the manufacture of the substrates often enters undesired spaces between the conductors and dielectric layers, thereby decreasing the performance of the substrate or even rendering it unusable. The conventional adhesion techniques used with conductors of high speed data transfer often proves inadequate or extremely expensive.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
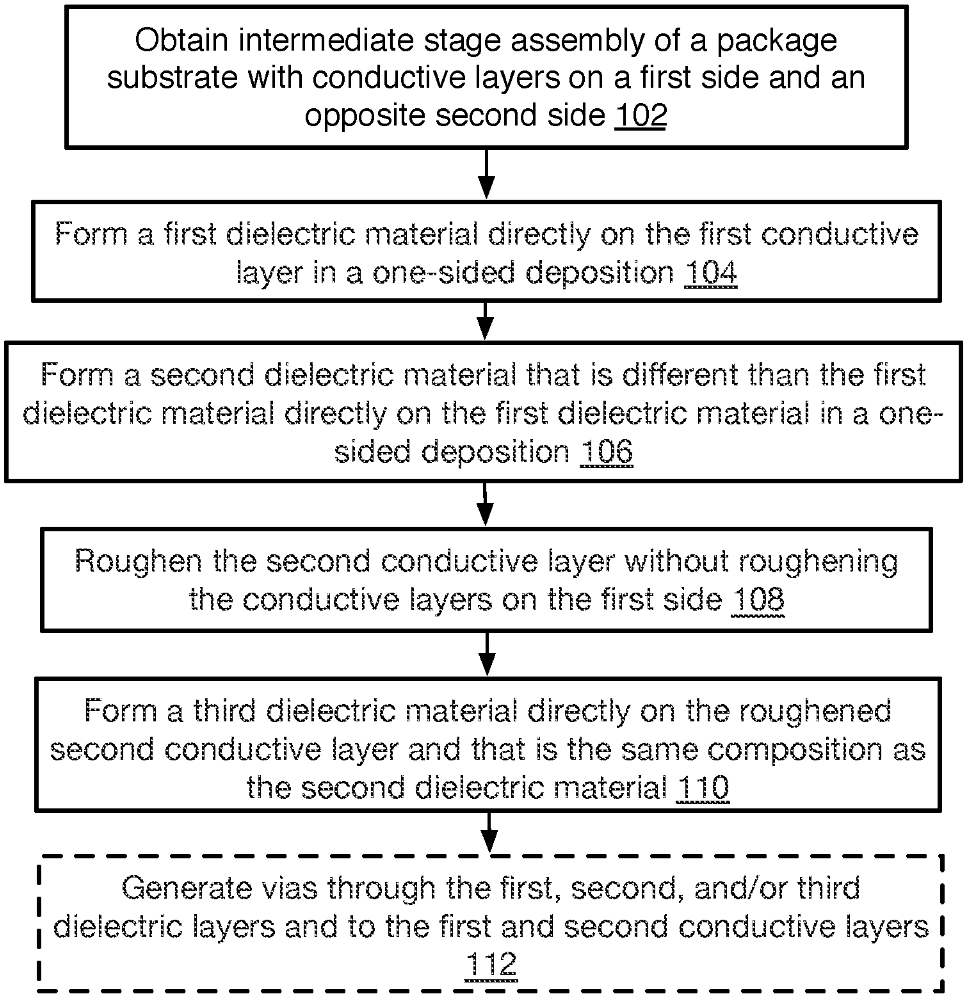
FIG. 1 is a flow chart of an example method of making an asymmetrical package substrate with conductive roughening on one side of the substrate and adhesion layer on the other side of the substrate according to at least one of the implementations of the disclosure.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein also may be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other implementations may be utilized, and structural and/or logical changes may be made without departing from the scope of claimed subject matter. It should also be noted that directions and references, for example, up, down, top, bottom, over, under, and so on, may be used to facilitate the discussion of the drawings and implementations and are not intended to restrict the application of claimed subject matter. Therefore, the following detailed description is not to be taken in a limiting sense, and the scope of claimed subject matter is defined by the appended claims and their equivalents.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an implementation" or "one implementation" refers to a particular feature, structure, function, or characteristic described in connection with the implementation is included in at least one implementation of the present disclosure. Thus, the appearances of the phrase "in an implementation" or "in one implementation" in various places throughout this specification are not necessarily referring to the same implementation. Furthermore, the particular features, structures, functions, or characteristics may be combined in any suitable manner in one or more implementations. For example, a first implementation may be combined with a second implementation anywhere the particular features, structures, functions, or characteristics associated with the two implementations are not mutually exclusive.

As used in the detailed description and the appended claims, the singular forms "a", "an" and "the" are intended to include the plural forms as well, unless the context indicates otherwise. It also will be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular implementations, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact.

Herein, the term "conductive feature" may refer to any metal structure within a package substrate that is part of the extra-chip circuitry, and is generally embedded within the dielectric material of the package substrate. Structures include traces and pads that are within a metallization layer or plane (e.g., in-plane). Vias that interconnect in-plane conductive features within adjacent metallization levels are included as well. "Conductive features" may be substituted by simply "features" at times within the disclosure.

Here, the term "circuit" or "module" may refer to one or more passive and/or active components that are arranged to cooperate with one another to provide a desired function. The term "signal" may refer to at least one current signal, voltage signal, magnetic signal, or data/clock signal.

Here, the term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

As the goals of the integrated circuit industry are achieved, package substrates require significantly higher speed and higher density input/output (JO) (HSIO) routing for traces and chip-to-chip interconnect technologies. In one example, higher speed input/output data transfer is an essential requirement in enabling the support for serializer/deserializer (SerDes) interconnects at 28 GHz or greater. As will be understood, such interconnects need to operate with high frequencies, while having low signal or insertion losses. Particularly, at high frequencies, a significant majority of signal transfer within an electrical conductor (e.g. electronic traces, interconnects, etc.) occurs close to the surface of the electrical conductor, which is known as the "skin effect". For example, at 1 MHz, the signal transfer occurs within a skin depth at about 66 microns from the surface of the electrical conductors. At 28 GHz, the skin depth reduces to about 400 nanometers from the surface of the conductor, at 100 GHz to about 200 nm, and at 200 GHz shrinks to about 150 nanometers.

In addition, the density of input output (IO) routing is increasing for HSIO signal routing and is an integrated interaction between via size, number of conductor lines, and spacing (or line or routing pitch) between lines (referred to as L/S), bump pitch, via-to-pad alignment, pad-to-via alignment, and material (e.g., resist and thin dielectric material) properties.

The conventional technique for adhering the conductor layers, with a material such as copper, to the dielectric layers, with a material such as an organic polymer and inorganic filler composite, is by mechanical adhesion techniques such as roughening the surface of the conductors which can gouge the conductor surfaces to depths of 200 nm or more. This often causes unacceptable insertion loss levels due to the skin effect and particularly with the high speed IO (HSIO) data signal conductors and reduced L/S of the conductors. The roughened surfaces cut through the skin depth of the high frequency signals forcing relatively significant diversions or disruptions of the signals transmitting through the conductors causing the increased insertion loss. Thus, these high speed conductors should have very smooth surfaces instead.

Attempts to provide a solution include reduction of the overall signal speed of the device to avoid distortion on HSIO traces entirely dedicated to high-speed signal conduction. Clearly, this is quite undesirable when many applications depend on such high speed transmission.

Thus, the use of chemical adhesion techniques are often used instead of roughening the conductors. This includes covering the conductors with an adhesion layer, and for example by depositing a dry material by physical vapor deposition (PVD) on the conductors and then applying a dry via cleaning process to provide access for vias to be attached to the conductors and on both the front and backsides of the package substrate. The compositions used as the adhesion layers, such as SiNx in PVD processes, however, are very expensive because of very high equipment and maintenance costs for these technologies. Such technologies are usually used in the Si wafer based device fabrication process, which is much less cost sensitive and operate at a much higher per unit sale price than with SiNx in a PVD process.

To resolve these issues, an asymmetrical package substrate is formed with an adhesion layer between dielectric layers and conductive features on one side of the substrate, and roughened conductive features on the opposite side of the substrate. By one approach, the adhesion layer side of the substrate may have smooth copper HSIO traces, while the roughened side of the substrate may have larger non-HSIO conductive features for power routing for example. By one form, the adhesion layer comprises SiNx and is formed by using a one-sided dry SiNx deposition process along with a one-sided dry via (hole) cleaning process, in conjunction with wet etching to create the asymmetric architecture having SiNx deposited on one side, while using roughened conductive features on the other side for better adhesion between the conductors and the dielectric layers.

In one particular example, the disclosed substrate has a first side and a second side opposite the first side. A first conductive feature, such as an HSIO trace, on the first side has a first surface, and a first dielectric material, such as an adhesive layer, is in contact with the first surface where the first dielectric material has a first composition comprising silicon and nitrogen. A second conductive feature, such as a non-HSIO trace or pad, on the second side of the substrate has a second surface. A second dielectric material, such as a lamination layer, is in contact with the second surface where the second dielectric material has a second composition different than the first composition. A surface roughness of the second surface is greater than a surface roughness of the first surface, which is to be maintained as a smooth surface. The first surface does not undergo any intentional roughening operation while the second surface is intentionally roughened.

This approach can provide strong adhesion of smooth conductors, such as copper traces, to dielectric for HSIO or other high frequency routing while eliminating the need to deposit an adhesion layer, such as SiNx, on all layers on all sides of the substrate, thereby reducing overall affordability. Such one-sided dry film technology better enables architectures with backside power delivery while the signal traces are routed on a frontside of a package substrate. This in turn provides greater flexibility in the arrangements or architecture of such substrates.

To these ends, described herein is a package substrate for IC packages with substrate metallization on a first or frontside of the substrate that at least includes conductive features that remain relatively smooth such as with HSIO traces and pads. Other non-HSIO structures such as via landing pads and non-HSIO traces also may be present on the frontside as well. An opposite second (or reverse or back) side of the substrate may have substrate metallization that is roughened such as non-HSIO traces and landing pads, although HSIO conductive features could be present on the backside as well. The terms frontside and backside herein merely relate to opposite sides of a substrate, which may refer to the opposite sides of a substrate layer or base layer such as a core, center board, or middle layer where the layers are stacked outward from the core or base layer and in opposite directions on the two sides. While the frontside may indicate an active side to be attached to one or more dies and the backside may be a land-side that attaches to a circuit board, this is not always the case, and the reverse could be used.

In this disclosure, HSIO features such as HSIO traces may be entirely dedicated to high-speed signal conduction, therefore requiring smooth surfaces to reduce losses that may compromise signal quality, or may be used to carry non-HSIO signals as well. Non-HSIO features, however, cannot carry HSIO signals, and may conduct lower speed I/O signals or be employed in power routing. In some implementations, non-HSIO features may be part of the HSIO signal routing as through-layer vias and pads for vertical interconnection of HSIO traces.

The conductive features may have various degrees and combinations of surface roughness. For example, HSIO features on the frontside such as HSIO traces may have a smooth (e.g., unroughened) surface on all sides that is at least partially covered by a first dielectric adhesive layer for adhesion to an outer dielectric layer, while the backside may have non-HSIO features such as traces or landing pads for vias that are roughened on one or more sides, or all sides, to reduce the risk of delamination of adjacent dielectric material from the metal surfaces of the landing pad or trace. This architecture may be accomplished during package substrate fabrication by using one-sided dry deposition of a dielectric SiNx adhesion layer and one-sided deposition of a dielectric lamination layer over the adhesion layer, which shields the conductive features and the adhesion layer from chemical attack (e.g., a roughening etch), while leaving the surfaces of the conductive features on the backside exposed to roughening conditions in a particular process. The resulting roughened surfaces of the conductive features being located only on the backside may be an adequate compromise architecture that balances cost with adequate adhesion between conductive features and the dielectric or lamination layers. It should be noted that in some implementations, non-HSIO conductors on the frontside may be covered by an adhesion layer instead of being roughened, while HSIO conductive features on the backside may be roughened whether permanently or just initially as described below in order to maintain the reduced amount of adhesion material being deposited without resulting in too much insertion loss at the HSIO conductive features.

When both HSIO and non-HSIO features are present on the backside, the HSIO features may be smoothed by laser annealing of the roughened surfaces. Partial melting of the feature may occur, causing a rounding and blending of the surfaces. The localized heating of the HSIO features may cause some ablation of the adjacent dielectric material in the vicinity of the HSIO features. An ablation damage zone surrounding the HSIO features may be present, with little or no effect on insertion loss.

Referring to FIG. 1, an example process 100 provides for making an electronic package substrate with a dielectric adhesion layer over smooth conductive features on one side of the substrate while roughened conductive features are on the other side of the substrate according to at least one of the implementations herein. Process 100 includes operations 102 to 112, numbered evenly.

Process 100 may include "obtain an intermediate stage assembly of a package substrate with conductive layers on a first side and an opposite second side" 102. Here, a partial package substrate is received and prepared for fabrication of roughened conductive features and deposition of adhesion layers on opposite sides of the substrate, according to some implementations. In this example, the substrate may have a center board, middle layers, or core where the layers are stacked outward and in opposite directions from the center board or core referred to herein as the frontside and backside as introduced above. The as-received package substrate may comprise a top-level metallization plane on the surface of a dielectric material on both sides of the substrate and that has been plated (e.g., by galvanic electroplating or by electroless deposition) in a previous operation. In some implementations, the package substrate may be fabricated in a build-up process (e.g., a bumpless build-up layer (BBUL) package), whereby the package is formed by build-up of individual levels that each level may have a dielectric film and a metallization plane integral with the dielectric film.

In more detail, metallization planes may comprise conductive features fabricated from electrodeposited copper (a semi-additive process) or etched (a subtractive process) through a lithographically defined photoresist mask. New layers may be added to both sides by a build-up package in cycles of dielectric film lamination and formation of a new metallization plane over the laminated dielectric film. The dielectric materials may comprise organic and ceramic dielectric materials. In some implementations, all of the conductive features herein comprise copper or an alloy of copper, although other conductive metals or metal alloys could be used.

As mentioned above, conductive features may be divided into high-speed I/O (HSIO) conductive features and non-HSIO conductive features that do not conduct high-speed signals, and therefore are not sensitive to surface roughness. In general, non-HSIO features are larger than HSIO features, and non-HSIO traces may not be as long as HSIO traces. Roughening non-HSIO features may not impact device performance. Also, it is understood that vias described in this disclosure, including vias associated with HSIO traces and pads, are typically non-HSIO features but could be HSIO features as well. HSIO conductive features may include I/O traces exhibiting a smooth surface finish that is to be maintained without intentional roughening on the frontside of the substrate, while Non-HSIO conductive features on the backside of the substrate may include structures having a greater surface roughness. Included in this category may be pads that are integral with vias, known as landing pads or via pads. It is noted that throughout the disclosure, average surface roughness also may be referred to as the surface finish.

By one form, conductive features (e.g., traces) may be formed by semi-additive electroplating copper over dielectric to thicknesses up to 40 microns, and by one for form, from 10 to 40 microns, and another form 1-100 microns. Semi-additive electroplating processes may include plating through a lithographically-defined openings in a photoresist mask. In multilevel package substrates, HSIO traces also may be vertically interconnected to higher or lower conductor planes and to high-speed circuitry in an attached IC chip such as a microprocessor by small diameter vias.

Process 100 may include "form a first dielectric material directly on the first conductive layer in a one-sided deposition" 104. For this operation, a permanent dielectric adhesion layer or thin interfacial layer or film may be deposited on one or more of the conductive features on the frontside. The adhesion layer may be deposited by physical vapor deposition (PVD), chemical vapor deposition (CVD), atomic vapor deposition (AVD), and/or molecular vapor deposition (MVD), and so forth. By one form, it is deposited or coated on the entire top surface of the frontside of the substrate. By alternative approaches, photosensitive layers, masks, and lithography could be used to place the adhesion layer(s) only on desired areas of the frontside of the substrate such as just over one, all, or certain ones of the conductive features or parts of the conductive features. This may include having the adhesion layer be amendable or conformal to at least the side edges of the conductive feature when a middle of the conductive feature will be exposed for via attachment for example.

By one form, the adhesion layer is stoichiometric $Si_3N_4$ or non-stoichiometric SiNx where x may be in the 0.01-10.00 range, and other alternatives may include silicon oxide, silicon oxynitride, carbon doped oxide (CDO), organic dielectrics, organic polymers, fluorine doped silicon dioxide, etc. SiNx may be provided in certain variations including with a catalyst of palladium, phosphorous, boron, tetrakis (triphenylphosphine) palladium ($Pd(PPh_3)_4$, and/or with a plasma application that enhances chemical bonding with oxygen or nitrogen containing ligands. Many other variations for adhesion layers between the conductor features and outer lamination layer may be used.

Process 100 may include "form a second dielectric material that is different than the first dielectric material directly on the first dielectric material in a one-sided deposition" 106. In this operation, a dielectric lamination layer may be placed over the adhesion layer on the frontside. This may be an organic layer of a molded resin (e.g., an epoxy resin), ceramic composite, composite organic films comprising or consisting of silica fillers embedded in an organic polymer, liquid crystal polymer, bismaleimide triazine resin, glass-reinforced epoxy laminate material frame retardant-4 (FR4), polyimide materials, and the like. This also may be a one-sided operation as described above so that the lamination only occurs on the frontside and not the backside. This lamination layer will then protect the adhesion layer and the smooth conductive features on the frontside. The roughen etching cannot penetrate this lamination layer.

Process 100 may include "roughen the second conductive layer without roughening conductive layers on the first side" 108. As-deposited (or as-etched), landing pads or traces (and other conductive features) on the backside may have a Ra value that is too low to ensure adequate adhesion of adjacent dielectric material without increasing Ra. As an example, as-plated conductive features formed in a semi-additive electrodeposition process may exhibit an as-plated surface finish having a Ra of less than 100 nm. For values of average surface roughness that are less than 100 nm, a risk of delamination of adjacent dielectric material exists without the addition of adhesion layers, degrading device reliability.

The surface finish of conductive features may be characterized by the average surface roughness measurable by electron microscopy or profilometry. Surfaces of non-HSIO conductive features (e.g., buried landing pads and non-HSIO traces) may be characterized by an average surface roughness Ra (alternatively, Rq, the root mean square (RMS) surface roughness, may be employed as a metric of surface roughness) of 100 nm or higher for promotion of adhesion of the dielectric material to the copper. Throughout the disclosure, Ra may be the primary metric of surface roughness. Ra may be measured by profilometry, interferometry, or atomic force microscopy (AFM).

Ra (or Rq) of a metal (e.g., copper) surface may be increased on the backside by a wet or dry etch process employed to attack the conductive features including non-HSIO conductive features on the backside. Surfaces subject to such attack may include top surfaces and sidewalls of traces and pads. Cross sections of electroplated conductive features may be substantially rectangular or trapezoidal, as conductive features may be plated into patterned openings in a photoresist plating mask or blanket-plated over the package dielectric and then patterned by a wet etch through a photoresist etch mask. After removal of the photoresist, three sides of the cross section, including the top surface and sidewalls, may be exposed. While the present disclosure generally relates to roughening all three exposed surfaces of a conductive feature, it will be appreciated that selective roughening could be used to only roughen certain sides (top or sidewalls) of the conductive feature instead and when desired.

After the deposition of the dielectric lamination layer on the first side, a wet roughening etch (or other wet adhesion promotion process) may be applied to the entire substrate. This may include the use of a relatively weak copper etch solution that will not damage dielectric layers. While the wet etch process here is dual sided, it only impacts the only unprotected exposed copper features which are on the backside substrate. The smooth conductive features on the frontside and the adhesion layer will be protected by the outer dielectric lamination layer on the frontside so that the roughening etch does not roughen the conductive feature and the adhesion layer. In some implementations, the Ra of the exposed top surfaces may be increased by gas phase methods as well.

The roughening etch works by causing a relatively slow chemical attack by the wet roughening etchant that may result in controlled pitting and localized dissolution of the exposed surfaces of the conductors. Pitting and localized dissolution may occur at surface sites having defects such as microscopic cracks, grain boundaries and dislocations. A resulting surface roughness may ensue, controlled by the etch conditions. In some implementations, the average surface roughness of the exposed surfaces may be increased by inert gas sputtering bombardment. In some implementations, a dry plasma etch method may be employed as well whereby a gas phase chemical attack may be enhanced by plasma bombardment and volatilization of dislodged metal atoms. The degree of roughness may be controlled by the nature of the chemical attack, and conditions such as etchant concentration, temperature and exposure time. Different wet and dry chemistries may be employed to achieve desired surface finish (e.g., Ra) of the conductive features.

Process 100 may include "form a third dielectric material directly on the roughened second conductive layer and that is the same composition as the second dielectric material" 110. Here, the lamination layer on the backside is formed over the now roughened second conductive features. The lamination layer on the backside may have the same composition as the lamination layer on the frontside. The backside lamination layer also may be formed by using a one-sided process as with the adhesion layer and the first dielectric material on the frontside.

Process 100 may include "generate vias through the first, second, and/or third dielectric layers and to the first and second conductive layers" 112. After both sides of the substrate have the lamination layers, via holes may be drilled through the third dielectric layer in a one-sided process on the backside to expose the back conductive features. Optionally, the holes may be formed by a suitable etch process such as a deep reactive ion etch (DRIE) or a suitable wet etch exposing portions of top surfaces of the conductive features for via formation by electrodeposition methods. Etch processes may require additional lithographic steps, whereas laser drilling may be performed as a direct write process.

A wet desmear cleaning can then be applied although it attacks both sides of the substrate. However, the dielectric layer on the frontside will protect the adhesion layer and conductive features on the frontside. Thereafter, the frontside dielectric layer may be drilled through to provide via holes to the front conductive features. A dry via cleaning can then be provided on the frontside via holes that is a one-sided process that will not damage the exposed conductive features on the backside via holes.

Next, the holes on both side may be filled to form the vias. The vias may be formed by electrodeposition (e.g., galvanic or electroless deposition) copper or a suitable alloy of copper into openings (not shown). This operation may include forming pads on the distal ends of the vias.

The entire construct can now proceed towards the usual copper seeding, lithography, and copper plating semi-additive process (SAP) operations to construct further external vias and complete conductive routing on the substrate. If required, the process flow can be extended to leverage a one-sided conductive seed sputter deposition process as well in order to form the vias and pads.

It will be appreciated that by one alternative, process 100 is repeated for each level being built upon the substrate thereby alternating deposition of metallization layers and dielectric layers to form the stacks on each side of the substrate. By yet another alternative, however, multiple stacked levels, each with a dielectric layer (and adhesion layer in the front) over a metallization layer, may be constructed on one side of the substrate before constructing multiple levels on the other side of the substrate. This may include an entire stack on the substrate being formed on one side of the substrate at a time, or some number of levels such as two or more levels being constructed before depositing layers on the opposite side. This may include lithography techniques to perform one-sided deposition of the conductive features.

Referring to FIGS. 2-9, an asymmetrical thin film interface architecture leverages the one-sided dry process capabilities of SiNx deposition, dry via (hole) cleaning process, lamination and via drilling. Intermediate electronic assemblies (or partial package substrates) show the application of process 100 used for the fabrication of a completed package substrate 900 (FIG. 9) according to some implementations of the disclosure. All partial and complete substrates in FIGS. 2-9 are shown in x-z axis cross-sections. Many components of the substrates in FIGS. 2-9 are the same and are therefore numbered the same and only described once when the component is introduced.

Figure 2:
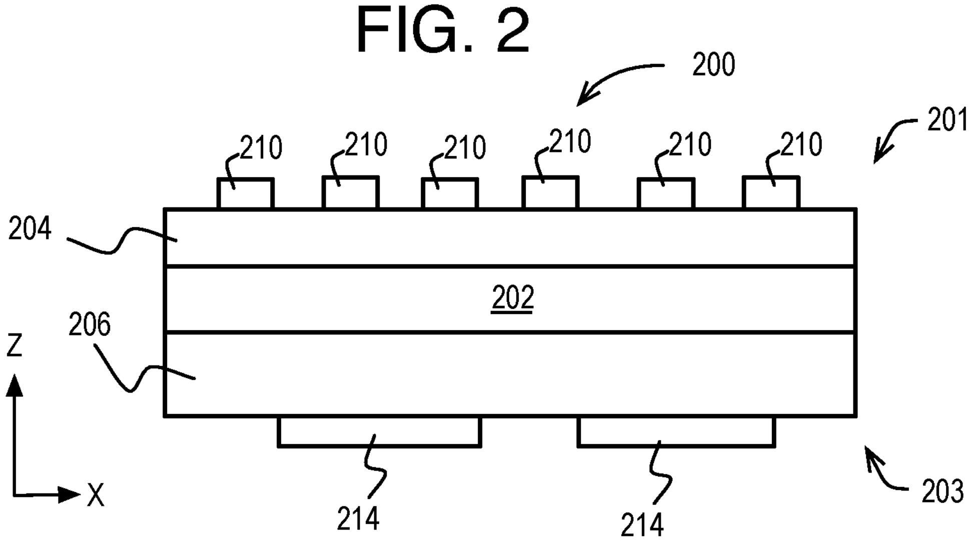
FIGS. 2-9 are schematic diagrams of cross-sectional views in the x-z plane of partial package substrates and completed partial substrate used in an exemplary method as outlined in FIG. 1 for fabricating the package substrate according to at least one of the implementations of the disclosure.

Referring to FIG. 2, a partial package substrate 200 may be formed by a cored or coreless build-up layer process, as mentioned above, whereby dielectric material is deposited or laminated one layer at a time. The dielectric material may include organic film laminates or liquid resins (including ceramic composites) that may be molded into individual layers. An electroplated metallization plane may be formed over each dielectric layer, after which another dielectric layer is added over the metallization plane. The dielectric layer thickness may range between 10 and 100 microns by one example. The metallization planes or layers may comprise copper having a thickness (height) under 40 microns, or otherwise ranging between 5 and 40 microns and may be formed by semi-additive electrodeposition (e.g., of copper).

Particularly, substrate 200 may have a core, center board, middle layer, or other such base structure or layer 202 that divides the substrate 200 into a frontside 201 and a backside 203. The base layer 202 itself may be formed of one or more dielectric layers, metal layers, or a combination of both. A stacking direction is outward from the base layer 202 and opposite on the two sides 201 and 203.

The frontside 201 has a metallization layer with front conductive features 210 that may be HSIO data signal pads or traces formed on a dielectric layer 204, while the backside 203 has back conductive features 214 that may include non-HSIO traces or pads formed on a dielectric layer 206. By one form, the frontside also may include non-HSIO conductive features on the frontside in addition to the HSIO conductive features to be covered by an adhesive layer, while the backside also may include HSIO conductive features to be roughened. The frontside conductive features 210 may be at most 200 microns wide each with thicknesses (heights) up to 200 microns, but by one form, are 50 microns wide.

Figure 3:
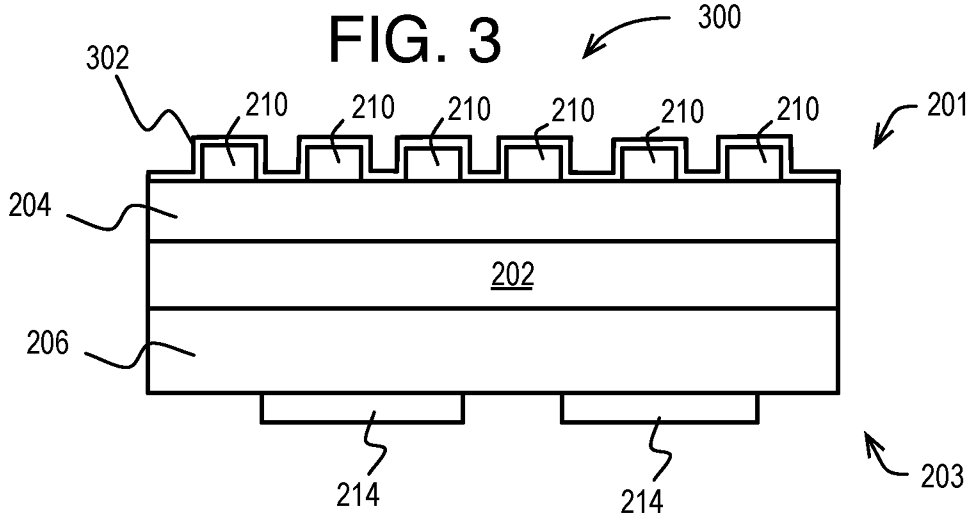

Referring to FIG. 3, a dielectric adhesion layer (or film or just dielectric material) 302 is deposited to form a partial substrate 300, and by blanket deposit in this example. The adhesion layer 302 may be deposited on, or in contact with, the conductive features 210 and may be conformal to the shape of the conductive features 210, and in this case to be placed adjacent both a top surface and sidewalls of the conductive features 210 thereby forming valleys between the conductive features 210. As noted above, the adhesion layer 302 may be a permanent layer directly covering the conductive features 210. The adhesion layer 210 may be engineered to provide better adhesion between the dielectric layer 402 (FIG. 4) to be placed above the conductive features 210 and the conductive features 210 to prevent or reduce delamination of the lamination layer 402 from the conductive features 210. By one form, the adhesion layer is a thin film at most about 5 microns thick. The adhesion layer in this example is formed of a dielectric such as SiNx or other adhesive materials as described above with operation 104.

The adhesion layer 302 also may be a protective layer to assist in protecting the conductive features 210, and particularly the smooth surfaces of the HSIO conductive features, on the frontside 201 from etchant. The adhesion layer 302 also may assist with a dielectric environment that may be more advantageous than that provided by package dielectric layer 402 alone. As an example, the permittivity (e.g., dielectric constant) of adhesion layer 302 may be smaller than the permittivity of package dielectric 402, reducing capacitive coupling between adjacent traces.

As an alternative to the blanket deposition, the adhesion layer 302 may be patterned when only certain areas of the substrate 300 are to be covered such as to uncover dielectric layer 204 or other non-conductive structures on the frontside 201. By one alternative, the roughening limitation on the frontside may only apply to the planar conductive features forming traces, pads, and caps for example. The adhesion layer 302 may be patterned by etching through a lithographically-defined photomask, or by ablation, employing a scanning laser, thereby circumventing lithographic operations.

Figure 4:
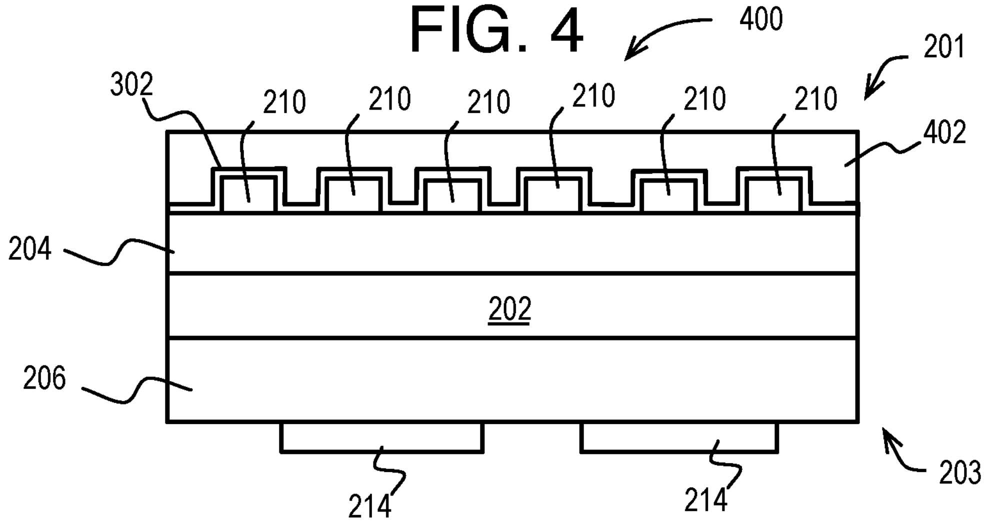

Referring to FIG. 4, a one-sided lamination operation is used to deposit dielectric layer (or material or just dielectric) 402 over the adhesion layer 302 in partial substrate 400. The composition of the dielectric material (or lamination layer) 402 is mentioned above in operation 106. The dielectric layer 402 acts as a protective layer during backside roughening to prevent or limit roughening etchant from damaging the adhesion layer 302 and the smooth conductive features 210 on the frontside.

In some implementations, dielectric or lamination layer 402 is a single layer of dielectric (e.g., a dielectric laminate or a molded resin) having a thickness between 10 and 100 microns, and by one form up to 200 microns. In some implementations, dielectric 402 is part of a multilayer package stack comprising multiple dielectric layers, where only one portion of the package is shown in the figure. In some implementations, dielectric 400 may comprise multiple layers of an organic laminate, each laminate layer having thicknesses ranging between 10 and 100 microns. While dielectric layer boundaries may coincide with conductor levels, multiple layers of dielectric may be between conductor planes.

Figure 5:
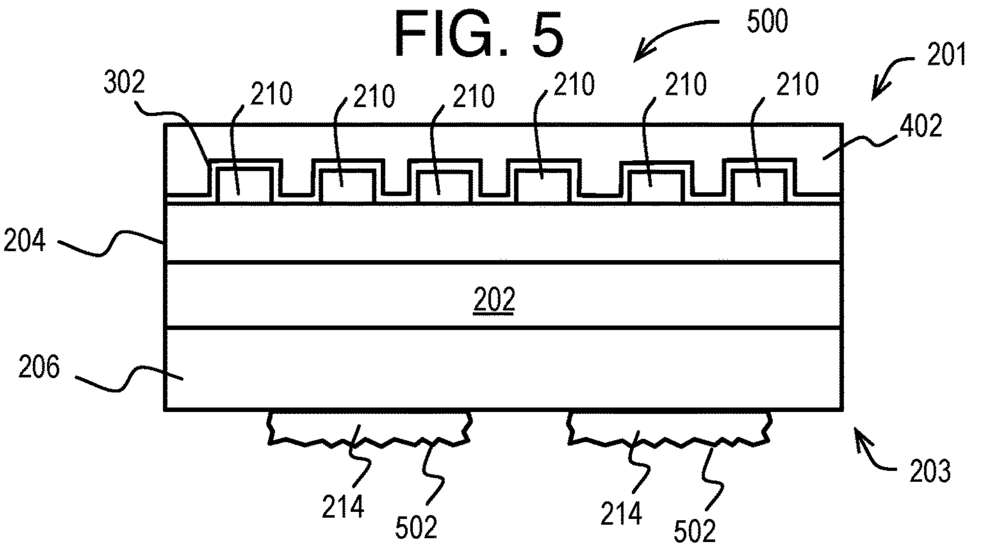

Referring to FIG. 5, a partial substrate 500 shows conductive features 214 after roughening to generate roughened surfaces 502 on the backside 203. As mentioned, this may be performed with a wet etch process that attacks any exposed metallization on the entire substrate. The adhesion layer 302 and smooth conductive features (and non-HSIO features when present on the frontside) 210 are protected by the lamination or dielectric layer 402. Also as mentioned, the conductive features 214 on the backside may be roughened on all exposed surfaces including top and sidewalls, but could be selective to only roughen either sidewalls or top surfaces when desired by using lithography techniques, for example. The roughening may be over 100 nm, and by one form from 100 nm to 600 nm deep, on NON-HSIO conductive features on the backside that are 1 micron thick or more.

By one other alternative, the back conductive features 214 may include relatively high frequency HSIO landing or via pads on the backside 203 as well. Even though the entire surface of the pads may be roughened, vias will be placed over the center of the pads anyway so that roughening at least at the center of a pad does not matter with regard to insertion loss, while the roughening at the edges and sides can assist with adhesion. Such an arrangement may be necessary depending on the substrate architecture and when such roughening of the HSIO back conductive features does not significantly increase insertion loss.

By yet another alternative, conductive features 214 that are HSIO routing, such as HSIO traces, in the backside 203 may be roughened and then re-smoothed by laser reflow polishing, for example. Thus, a laser beam may be positioned over an individual HSIO features thereby causing a reflow of the surfaces of the trace by intense heating. Asperities, pits and other surface defects then may be annealed, reducing the average surface roughness of the traces below an acceptable limit, such as with an Ra below 100 nm. During the reflow process, adjacent dielectric material may be ablated and melted as a result, forming a damage zone in the immediate vicinity surrounding the HSIO feature. The damage zone may be repaired by backfilling with dielectric material.

Otherwise, roughening of conductive features 214 that are HSIO traces may be maintained on the backside as well. For example, while insertion loss of the HSIO traces may be increased somewhat by the roughening relative to their pre-roughening state, this may be an acceptable compromise to obtain desired increased area adhesion of dielectric layer supported by roughened surfaces on the backside 203. For example, HSIO traces may be concentrated in a substrate region on the backside 203 substantially devoid of vias and landing pads. Overall substrate integrity may be enhanced by including roughened top surfaces of HSIO traces in the substrate region where landing pads are scarce.

Figure 6:
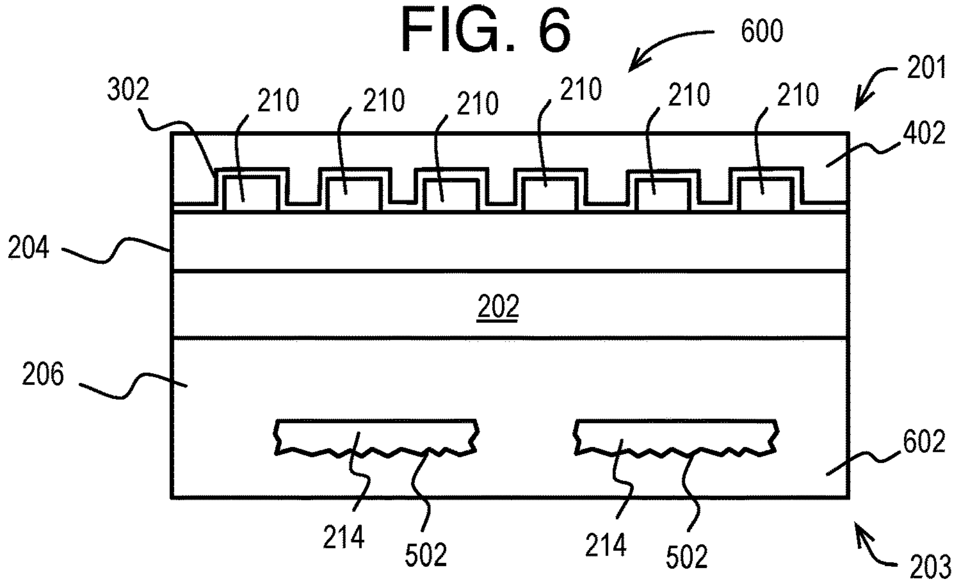

Referring to FIG. 6, one sided-lamination then may be performed on the backside 203 to form partial substrate 600 with a back lamination or dielectric layer (or dielectric material or just dielectric) 602. The one sided operations are as described above with operation 104 and 106, and the composition of the lamination layer 602 may be the same as lamination layer 402, but could be a different dielectric material when desired. The back lamination layer 602 embeds the roughened conductive features 214 to form a strong adhesion with the conductive features 214 due to the roughening. Upper layers or levels then may be formed on the lamination layer 602 including additional alternating dielectric and metallization layers.

Figure 7:
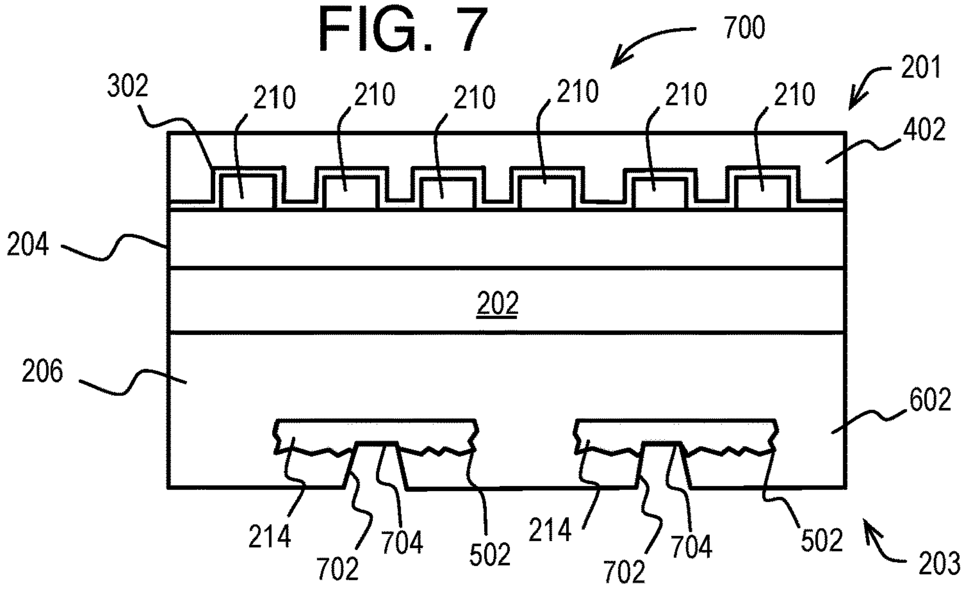

Referring to FIG. 7 for one example form here, a partial substrate 700 shows the results of drilling on the backside 203 in order to provide clear pathways to the back conductive features 214 for vias. Drilling may be performed by laser drilling. In this example, back conductive features 214 are, or have, landing pads for example, having thicknesses ranging between 10 and 50 microns for example. When conductive features 214 are pads, the pads may be landside interconnects for bonding package substrate 900 to a printed circuit board (not shown) or could be for vias connecting to other metallization levels.

A drill or via hole 702 is formed by the drilling and extends through the lamination or dielectric layer 602 and exposes the conductive features 214 within the hole 702. The drilling also may result in somewhat smoothing the exposed surfaces 704 of the conductive features 214 within the holes 702. Roughened surfaces of the conductive features 214 are still embedded within the dielectric layer 602. A wet desmear or wet via (hole) cleaning process then may be applied to clean drilling debris out of the hole 702. Although wet desmear attacks any exposed metal surface on any side of the substrate, the front conductive surfaces are protected from damage by the front dielectric layer 402 at this stage.

Figure 8:
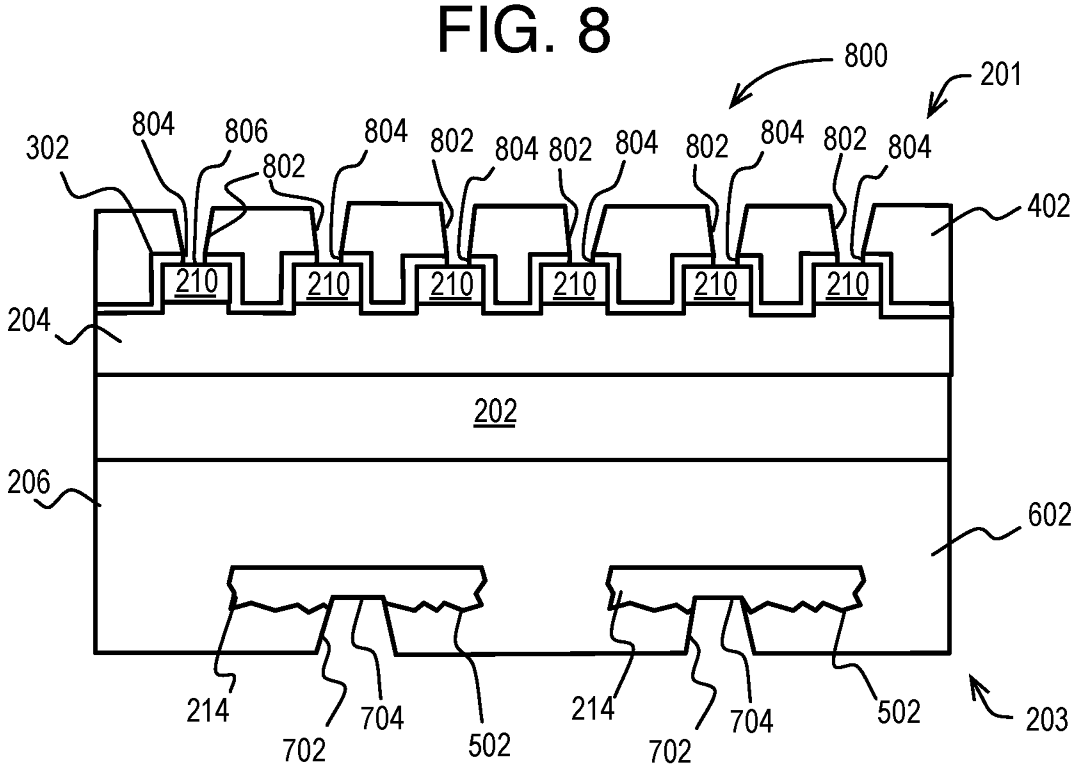

Referring to FIG. 8, the conductive features 210 on the frontside 201 may be pads or may be traces that are to connect directly to vias. Thus, a partial substrate 800 shows the result of one sided front laser drilling to form via holes 802 through the front dielectric layer 402 and a hole 804 through the thin adhesion layer 804. The drilling exposes a surface 806 of the conductive features 210 within the hole 802 and 804. Damage to the exposed surface 806 of the conductive features 210 and from the drilling does not need to be repaired since the via will fill any spaces on the exposed surface 806 anyway. A one-sided dry via cleaning process is then applied to clean debris from the front holes 802 and 804 without damaging the now exposed conductive features 214 on the baskside 203.

Figure 9:
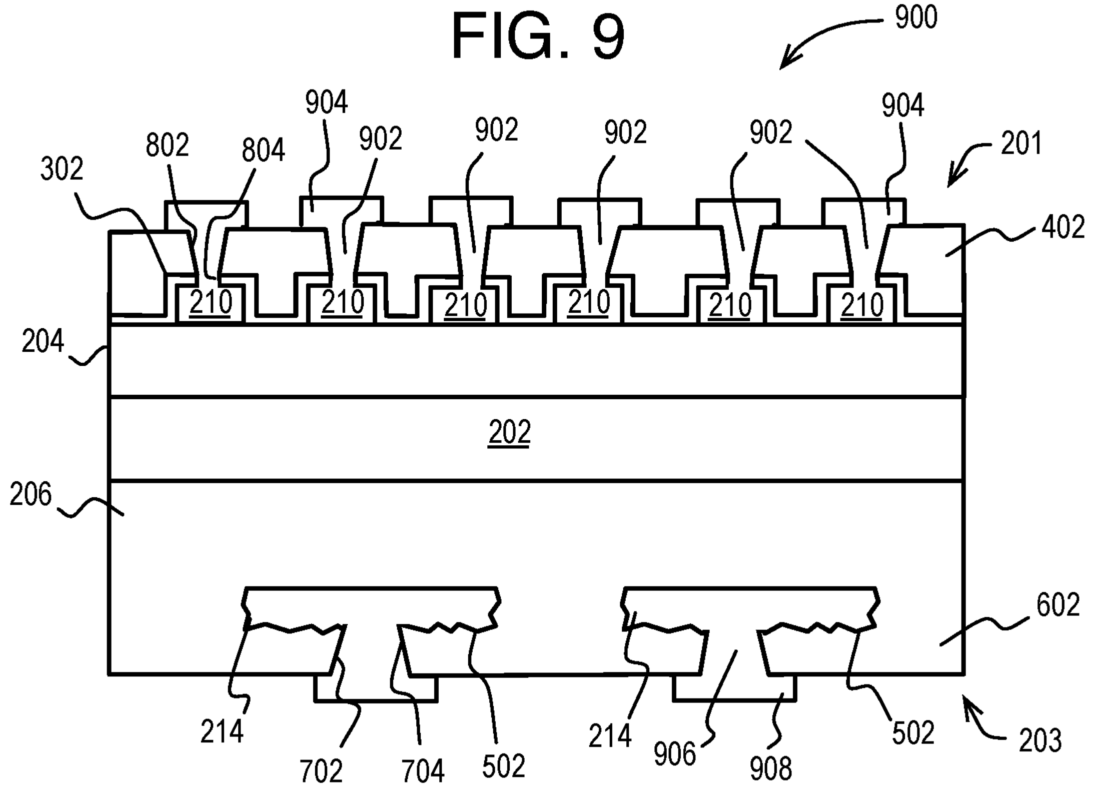

Referring to FIG. 9, a completed package substrate 900 shows vias constructed and filling the via holes drilled in the last operations. Thus, vias 902 are grown in openings 802 by electroplating copper or a suitable alloy of copper. In some implementations, vias 902 are formed by electroless deposition of copper or a suitable copper alloy. As described above, the remaining or peripheral surfaces of the adhesion layer 302 may still form a strong adhesion interface with bulk dielectric material in dielectric layer 402. Pads 904 may be formed over the surface of dielectric layer 402 adjacent to vias 902. Pads 904 are landing pads extending laterally beyond bases of vias 902.

Vias 902 and associated pads 904 are plated into openings 802 and 804 and over the adjacent dielectric 402, respectively. Pads 904 may be top-level die interconnect pads or landing pads for vias grown over pads 904 in subsequent operations. Vias 904 may be grown on front traces 210, which may be integral with non-HSIO traces (not shown) attached to vias that extend through the base layer 202 and interconnect traces 210 on the frontside 201 to power routing to a power source (e.g., a potentiostat) for electroplating and on the backside 203.

Traces 210 (serving as landing pads), extend laterally beyond bases of vias 902, leaving a peripheral region of upper surfaces to interface with bulk dielectric material in dielectric layer 402 to form strong adhesion to the dielectric layer 402. The smooth surfaces of the conductive features, when the conductive features are HSIO traces, may have an average roughness of less than 100 nm, or alternatively, equal to or less than 100 nm.

On the backside 203, vias 906 may be plated to holes 702 and pads 908 may be deposited to extend from the vias 906 and on the dielectric layer 602. The roughened periphery of bottom surfaces 502 (e.g., having an average surface roughness Ra>100 nm, and by on form, Ra>200 nm) may increase adhesion strength between pads or traces 214 and the bulk dielectric material of dielectric layer 602.

With this package substrate 900, the conductive features may have the adhesion structures described herein so that a certain portion of the total surface area (the top and sidewalls for example) of the planar conductive features from both sides that could be exposed for roughening is covered by an adhesion layer instead. By one approach, substantially 50% of the total surface area is covered by the adhesion layer and the other half of the total surface area is roughened. This significantly decreases the amount of material of the adhesion layer, such as SiNx, in a structure that still adequately adheres the dielectric to the conductive features on both sides of the substrate 900.

Figure 10:
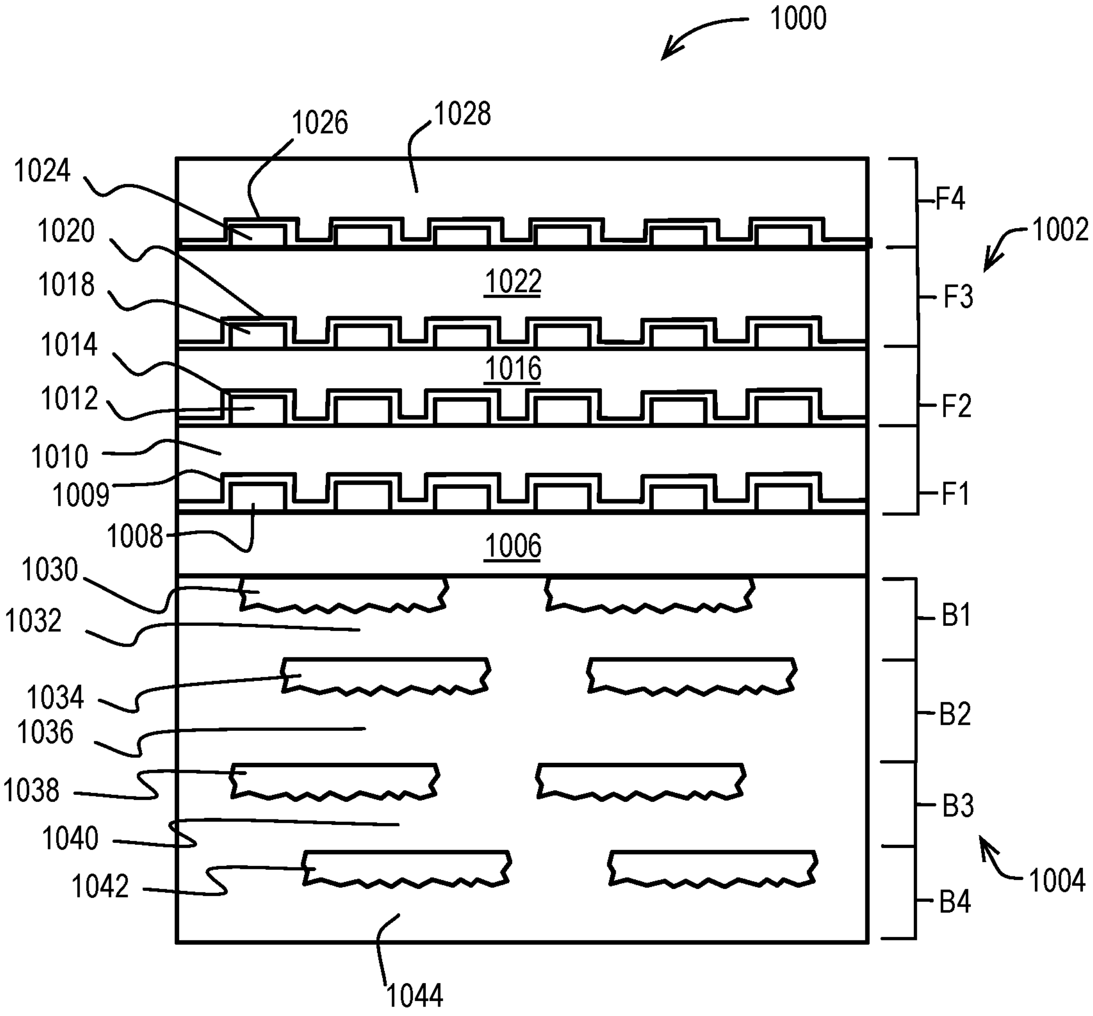
FIG. 10 is a schematic diagram of a cross-sectional view in the x-z plane of an alternative example package substrate according to at least one of the implementations of the disclosure.

Referring to FIG. 10 as an alternative approach, the substrate structure described above with alternating metallization and dielectric layers may be repeated for multiple levels. For example, a partial package substrate 1000 may have a frontside 1002 with multiple levels F1 to F4 numbered in order of a stacking direction and a backside 1004 with multiple levels B1 to B4 also numbered in a stacking direction opposite the stacking direction of the frontside. Each of levels F1 to F4 and B1 to B4 have both a metallization layer and a dielectric layer stacked in opposite directions from a center board or base layer 1006. For instance, and respectively for levels F2 to F4, the frontside 1002 has metallization or conductive layers 1008, 1012, 1018, and 1024 with dielectric layers 1010, 1016, 1022, and 1028 above the respective metallization layers, and with a respective dielectric adhesion layer 1009,1014, 1020, and 1026 between each pair of metallization layer and dielectric layer at each front level F2 to F4.

Likewise, the backside 1004 has metallization or conductive layers 1030, 1034, 1038, and 1042 paired with overlaying dielectric layers 1032, 1036, 1040, and 1044 above (or below) the respective metallization layers. The number of buried metallization layers or planes may depend on the number of build-up layers in the substrate. The metallization pattern of the top level and lower levels formed in the frontside may include I/O (e.g., data) signals while the metallization layers or planes on the backside 203 may include power routing, although this may not always be the case. In-plane conductive features of the metallization layers or planes for both power and I/O signals may comprise traces and pads. Vias may interconnect the different levels of metallization or may extend out of the top or bottom surface of the substrate 1000 for interconnection to dies, circuit boards, and so forth, and as described elsewhere herein.

By one form, all levels of the substrate 1000 on the frontside 1002 have conductive features covered by an adhesion layer as described above and no matter the type (HSIO or non-HSIO) of conductive feature. This may include non-HSIO conductive features on one or more, or all levels, that are still covered by adhesion layers instead of being roughened. By other forms, planar conductive features, not including via-related components for example, on the frontside are all high frequency HSIO traces or pads that should remain smooth. By yet another approach, one or more levels have planar or non-via conductive features that are entirely HSIO, while one or more other levels have non-via or planar conductive features that are entirely non-HSIO. This may result in alternating pattern of levels with HSIO and non-HSIO conductors for example. The backside may have the same or similar variations and combinations of HSIO and non-HSIO conductive features, except that in the backside 1004, all of the conductive features that are to be provided an insertion loess reduction technique will be roughened rather than having an adhesion layer placed directly between the back conductive feature and the dielectric layer.

It will be appreciated, however, that both sides 1002 and 1004 are not required to have the same number of levels.

Figure 11:
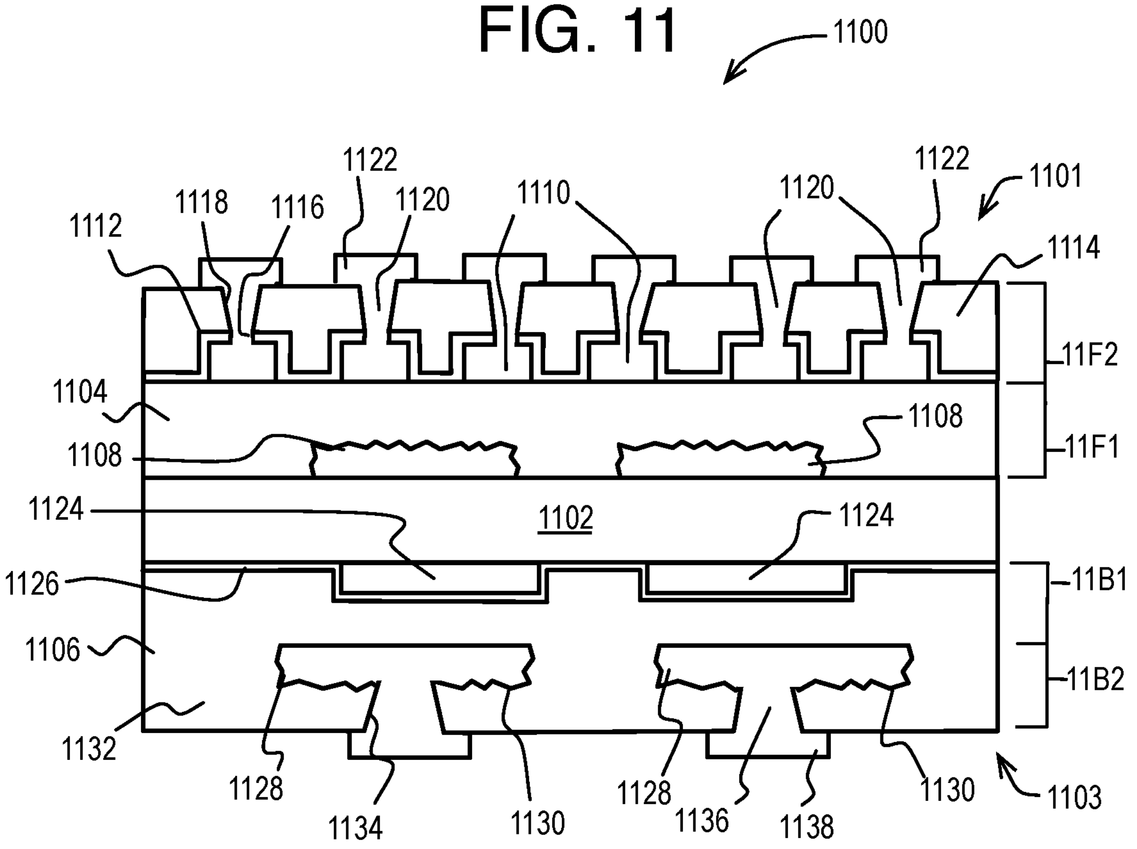
FIG. 11 is a schematic diagram of a cross-sectional view in the x-z plane of another alternative example package substrate according to at least one of the implementations of the disclosure.

Referring to FIG. 11 for another alternative, the location of the roughening and corresponding adhesion layer on the opposite sides of the same level when multi-levels are provided on the substrate may switch sides along the stacks. Specifically, a substrate 1100 has two front levels 11F1 and 11F2 and two back levels 11B1 and 11B2 stacked in opposite directions on a center base layer 1102. First level 11F1 includes roughened conductive features 1108 under a front dielectric layer 1104, and second level 11F2 has smooth conductive features under adhesion layer 1112 and dielectric lamination layer 1114. Vias 1120 and caps 1122 are shown above the lamination layer 1114 with the vias 1120 connected to the conductive features 1110, and as described above with substrate 900.

The backside first level 11B1 has smooth conductive features 1124 under adhesion layer 1112, and the backside second level 11B2 has roughened conductive features 1128 with rough surfaces 1130 and embedded in back dielectric or lamination layer 1106. Via holes 1134 permit connection between vias 1136 and via caps 1138 to the conductive features 1128. The compositions and parameters of the substrate layers are as described above with process 100 and substrate 900. For example, the roughened conductive features may have surface roughness over 100 nm while the smooth conductive features have roughness less than or equal to 100 nm.

Thus, the substrate 1100 has multiple levels, and here at least two levels each with two sides 11F1, 11F2, 11 B1, and 11B2. Each level has the first conductive feature with a lesser roughness and the second conductive feature with a greater roughness on the opposite sides 1101 or 1103 of the substrate 1100. Which of the front and back sides 1101 or 1103 has the first conductive feature (smooth feature) or second conductive feature (rough feature) changes on at least one of the levels. So for the illustrated example, the levels alternate as to which side has the smooth and rough conductive features. So while the first level, with regard to the conductive features or conductors, has rough conductors in the on frontside and smooth conductors on the backside, the second level has smooth conductors in the frontside, and rough conductors in the backside. This alternating pattern may be continued for more than the two levels shown and as more levels are stacked on these two levels. This is instead of the pattern of substrate 1000 where all smooth conductors and all rough conductors stay on one side of the substrate 1000. Here for this option, the pattern can be alternating or some other pattern as desired. Thus, no single level is limited to having a certain side (front or back) have the smooth conductor versus the rough conductor as long as it is one or the other. For any of the layers, the smooth conductors and adhesion layer should be covered by a lamination layer before the conductors on the opposite side and on the same level are to be roughened. Many variations exist as to which layers have a front side with smooth conductors rather the rough conductor on the same layer.

Figure 12:
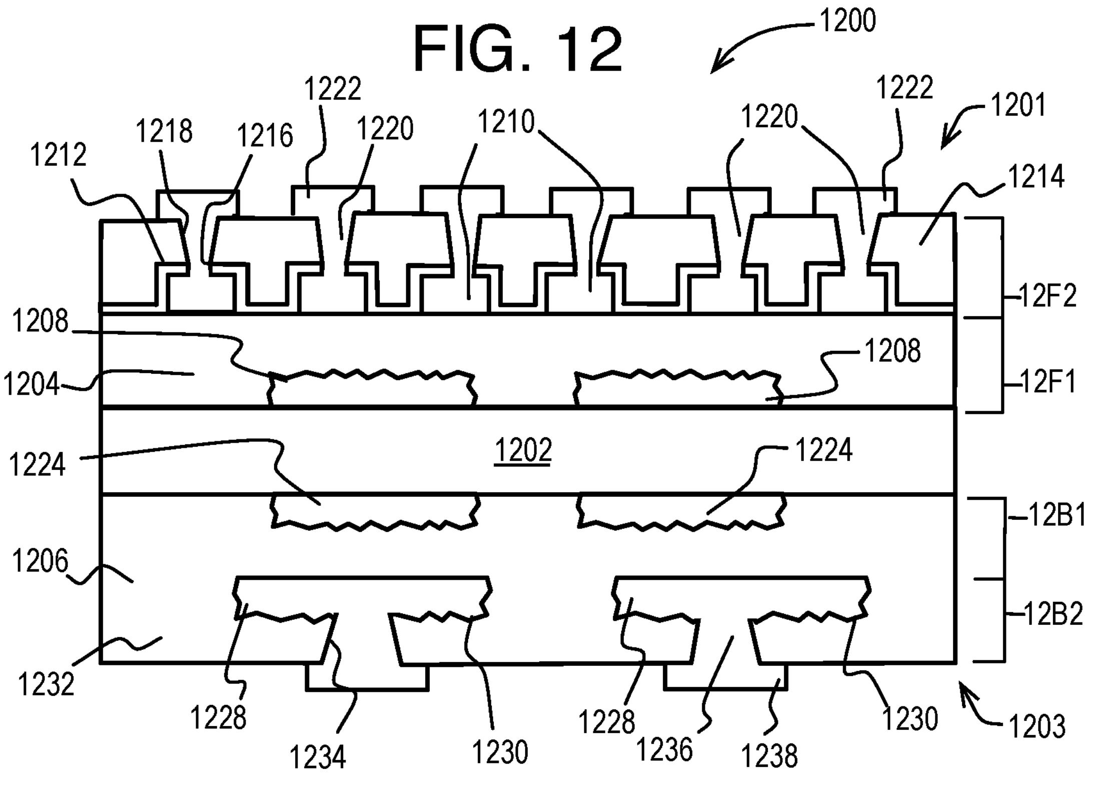
FIG. 12 is a schematic diagram of a cross-sectional view in the x-z plane of a further alternative example package substrate according to at least one of the implementations of the disclosure.

Referring to FIG. 12 to for yet another alternative, not all of the layers have both smooth conductors on one side and rough conductors on the other side. A single layer may have smooth conductors on both side (with corresponding adhesion layers over the conductors) or rough conductors on both sides of the substrate. In this example, a substrate 1200 has many of the same components as substrate 1100, are numbered similarly, and need not be described again. In this alternative, however, the backside 1203 first level 12B1 has roughened conductive features 1124 rather than smooth features so that the first level on both sides 12F1 and 12F2 of the substrate 1200 has roughened conductive features 1124 and 1208. Many variations exist as to which layers have the same roughness or smoothness on both sides of the substrate and which do not, as well as whether a single layer has both rough conductive features and smooth conductive features. Such layers with the same roughness may be interspersed with layers that have different roughness on the same layer.

Figure 13:
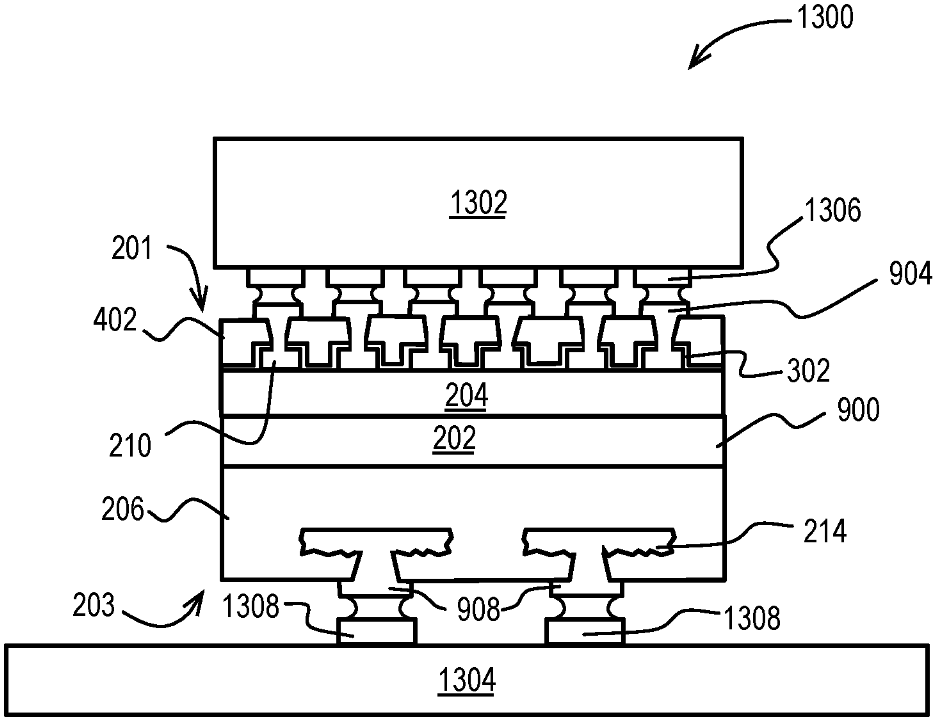
FIG. 13 is a schematic diagram of a cross-sectional view in the x-z plane of an implementation of a package substrate within an IC package according to at least one of the implementations of the disclosure.

Referring to FIG. 13, an IC package 1300 is shown with a cross-sectional view in the x-z plane of an implementation of package substrate 900 (FIG. 9) or 1000 (FIG. 10) within, according to some implementations of the disclosure. An implementation of package substrate 900 comprises conductive features 210 under an adhesion layer 302 on a frontside 201 and roughened conductive features 214 on a backside 203. The substrate 900 is shown assembled into package 1300, and comprising die 1302 bonded to package substrate 900. Package 1300 may be bonded to printed circuit board (PCB) 1304 through non-HSIO land pads 908 at a bottom metallization level of the substrate 900. Land pads 908 may be solder bonded to interconnects 1308 on a top plane of the PCB 1304 in this example as shown. The non-HSIO land pads 908 may be part of power routing from the PCB 1304 that provides power to die 1302 through via stacks that are not shown in this cross-section of substrate 900. Instead, interconnect pads 904 (which may be non-HSIO or HSIO) are shown on the frontside 201 and top of package substrate 900 (and shown bonded to die pads 1306) to convey data signals from HSIO traces and pads 210 to die 1302. In some implementations, package substrate 900 comprises a core 202. In some implementations, power planes on opposite sides 201 and 203 of the package core 202 may be interconnected by through-vias and/or copper plug inserts extending through the core (also not shown).

Figure 14:
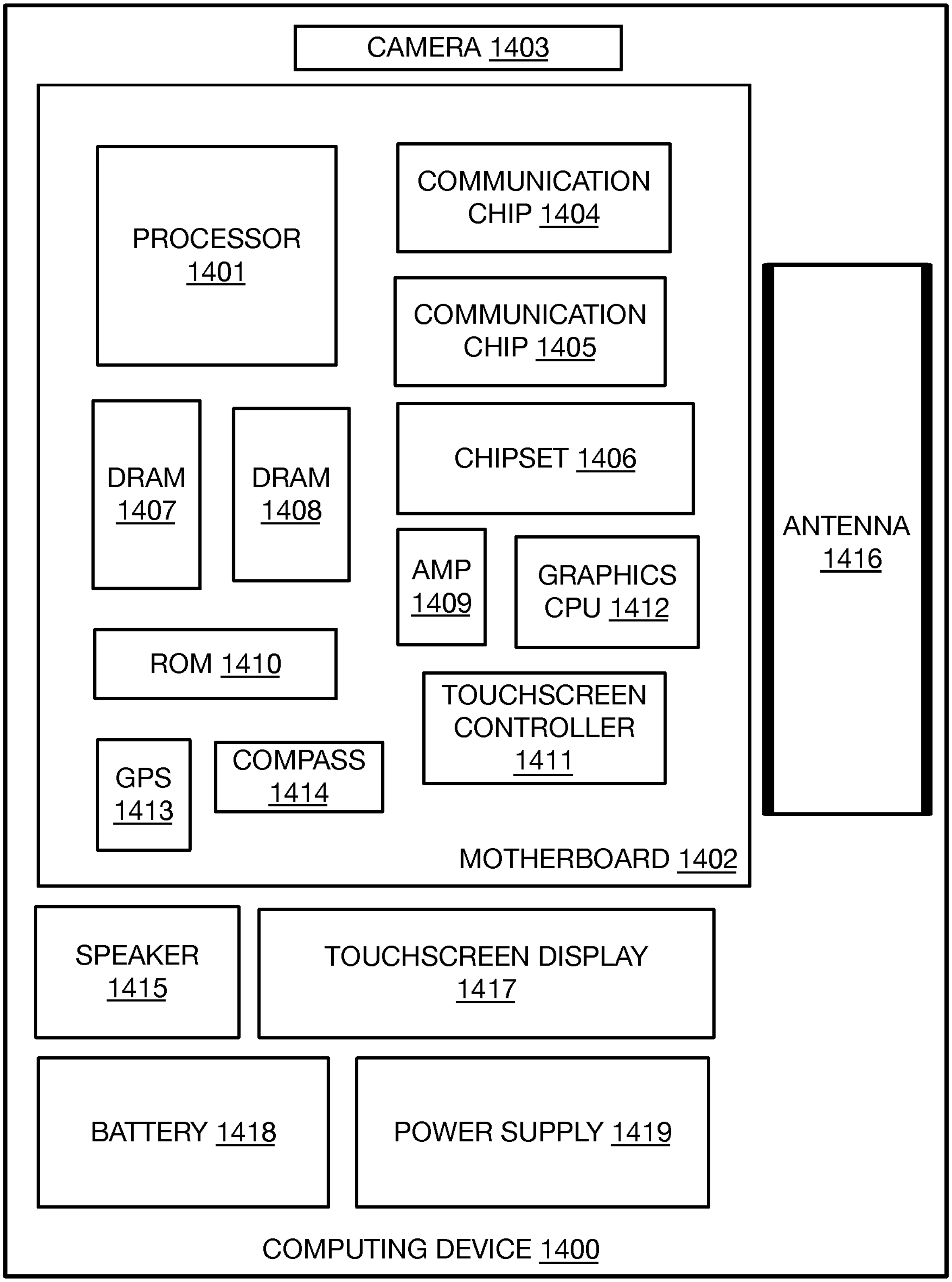
FIG. 14 is a functional schematic diagram of a computing device, all arranged in accordance with at least some implementations of the present disclosure.

Referring to FIG. 14, a computing device 1400 is arranged in accordance with at least some implementations of the present disclosure. Computing device 1400 may have any of the microelectronic assemblies found above including substrates 900 and 1000, and/or IC package 1100, for example, and further includes a motherboard 1402 hosting a number of components, such as but not limited to a processor 1401 (e.g., an applications processor) and one or more communications chips 1404, 1405. Processor 1401 may be physically and/or electrically coupled to the motherboard 1402. In some examples, processor 1401 includes an integrated circuit die packaged within the processor 1401. In general, the term "processor" may refer to any device or portion of a device that processes electronic data from registers and/or memory to transform that electronic data into other electronic data that may be stored in registers and/or memory. Any one or more device or component of computing device 1400 may include a die or device having substrates with one-sided adhesion opposite one-sided roughening and/or related characteristics as discussed herein. In various examples, the one or more communication chips 1404, 1405 also may be physically and/or electrically coupled to the motherboard 1402. In further implementations, communication chips 1404 may be part of processor 1401. Depending on its applications, computing device 1400 may include other components that may or may not be physically and electrically coupled to motherboard 1402. These other components may include, but are not limited to, volatile memory (e.g., DRAM) 1407, 1408, non-volatile memory (e.g., ROM) 1410, a graphics processor 1412, global positioning system (GPS) device 1413, compass 1414, a chipset 1406, an antenna 1416, a power amplifier 1409, a touchscreen controller 1411, a touchscreen display 1417, a speaker 1415, a camera 1403, a battery 1418, and a power supply 1419, as illustrated, and other components such as a digital signal processor, a crypto processor, an audio codec, a video codec, an accelerometer, a gyroscope, flash memory, and a mass storage device (such as hard disk drive, solid state drive (SSD), compact disk (CD), digital versatile disk (DVD), and so forth), or the like.

Communication chips 1404, 1405 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some implementations they might not. Communication chips 1404, 1405 may implement any of a number of wireless standards or protocols, including but not limited to those described elsewhere herein. As discussed, computing device 1400 may include a plurality of communication chips 1404, 1405. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1419 may convert a source power from a source voltage to one or more voltages employed by other devices of mobile computing platform 1100. In some implementations, power supply 1419 converts an AC power to DC power. In some implementations, power supply 1419 converts an DC power to DC power at one or more different (lower) voltages. In some implementations, multiple power supplies are staged to convert from AC to DC and then from DC at a higher voltage to DC at a lower voltage as specified by components of computing device 1400.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It is understood that the subject matter of the present description is not necessarily limited to specific applications illustrated in FIGS. 1-14. The subject matter may be applied to other microelectronic devices and assembly applications, as well as any appropriate electronic application, as will be understood to those skilled in the art.

The following examples pertain to further implementations. Specifics in the examples may be used anywhere in one or more implementations.

In example 1, an electronic device package comprises a substrate with a first side and a second side opposite the first side; a first conductive feature on the first side and having a first surface; a first dielectric material in contact with the first surface, wherein the first dielectric material has a first composition comprising silicon and nitrogen; a second conductive feature on the second side and having a second surface; and a second dielectric material in contact with the second surface, wherein the second dielectric material has a second composition different than the first composition, and wherein a surface roughness of the second surface is greater than a surface roughness of the first surface.

In example 2, the subject matter of example 1 wherein the package comprises a third dielectric material in contact with the first dielectric material, wherein the second and third dielectric materials have substantially the same composition.

In example 3, the subject matter of example 1 or 2 wherein the first conductive feature comprises a sidewall, and the first dielectric material comprises a substantially conformal layer in contact with the sidewall.

In example 4, the subject matter of any one of examples 1 to 3 wherein the first and second conductive features have substantially the same composition.

In example 5, the subject matter of any one of examples 1 to 4 wherein the first and second conductive features comprise Cu.

In example 6, the subject matter of any one of examples 1 to 5 wherein the second surface has an average surface roughness of at least 100 nm and the first surface has an average surface roughness less than 100 nm.

In example 7, the subject matter of any one of examples 1 to 6 wherein the first surface has an average surface roughness of at least 1 nm, and wherein the second surface has an average roughness of at most 600 nm.

In example 8, the subject matter of any one of examples 1 to 7 wherein the second conductive surface has a surface roughness six times greater than a surface roughness of the first surface.

In example 9, the subject matter of any one of examples 1 to 8 wherein the first conductive feature is part of a trace where the thinnest lines of the trace have a width that is at most 50 microns, and the second conductive feature wherein the thinnest lines of the trace have a width that is over 50 microns.

In example 10, the subject matter of any one of examples 1 to 9 wherein the second conductive feature is a power routing conductive feature.

In example 11, the subject matter of any one of examples 1 to 10 wherein the first and second conductive features comprise via pads, and wherein the pads on the first side are at least partly adjacent the first dielectric material, and the pads on the second side are roughened.

In example 12, the subject matter of any one of examples 1 to 11 wherein the conductive features on the first and second sides comprise traces, and wherein the traces on the first side are at least partly adjacent the first dielectric material, and the traces on the second side are roughened.

In example 13, a method of manufacturing an electronic package substrate comprises obtaining an intermediate stage assembly of a package substrate with a first conductive layer on a first side and a second conductive layer on a second side opposite to the first side; forming a first dielectric material directly on the first conductive layer in a one-sided deposition; forming a second dielectric material that is different than the first dielectric material directly on the first dielectric material in a one-sided deposition; roughening the second conductive layer without roughening conductive layers on the first side; and forming a third dielectric material directly on the roughened second conductive layer and that is the same composition as the second dielectric material.

In example 14, the subject matter of example 13 wherein the roughening comprises performing a wet roughening wherein both the first and second sides are exposed to etching material.

In example 15, the subject matter of example 13 or 14 wherein the method comprises covering the first conductive layer on the first side with the first and second dielectric material before performing the roughening.

In example 16, the subject matter of any one of examples 13 to 15 wherein the method comprises covering multiple first conductive layers each with the first dielectric material on the first side before roughening any of multiple second conductive layers on the second side.

In example 17, the subject matter of any one of examples 13 to 15 wherein the method comprises alternating forming a first conductive layer with a first dielectric material on the first side and then forming a roughened second conductive layer on the second side, and repeated with individual levels of multiple levels on each side of the substrate.

In example 18, the subject matter of any one of examples 13 to 17 wherein the method comprises flipping the substrate after forming the second dielectric material directly on the first dielectric material on the first side to provide the third dielectric material over roughened second conductive layers on the second side.

In example 19, the subject matter of any one of examples 13 to 18 wherein the method comprises generating vias through the first and second dielectric layers and to the at least one first conductive layers of the first side.

In example 20, the subject matter of any one of examples 13 to 19 wherein the roughening comprises roughening the second conductive layer to have an average roughness of at least 100 nm, and wherein the first conductive layer has an average roughness less than 100 nm.

In example 21, an electronic system comprises a board; and at least one electronic asymmetrical substrate on the board, comprises a substrate with a front side and a back side opposite the front side; a first conductive feature on the front side and having a first surface; a first dielectric material in contact with the first surface, wherein the first dielectric material has a first composition comprising silicon and nitrogen; a second conductive feature on the back side of the substrate and having a second surface; and a second dielectric material in contact with the second surface, wherein the second dielectric material has a second composition different than the first composition, and wherein a surface roughness of the second surface is greater than a surface roughness of the first surface.

In example 22, the subject matter of example 21 wherein the second conductive feature on the back side comprises at least one high speed IO data signal conductor with at most a 50 micron width that is roughened, and wherein the first conductive feature comprises at least one non-roughened non-high speed IO data signal conductor with a single line trace width that is larger than 50 microns and is at least partly under the first dielectric material on the front side.

In example 23, the subject matter of example 21 wherein the substrate has multiple levels each with the first and second conductive features respectively on the opposite sides of the substrate, and wherein each trace and pad on the front side of the multiple levels is the first conductive feature with a lesser roughness, and wherein each trace and pad on the back side of the multiple levels is the second conductive feature with a greater roughness.

In example 24, the subject matter of any one of examples 21 wherein the substrate has multiple levels and each level has the first conductive feature with a lesser roughness and the second conductive feature with a greater roughness on the opposite sides of the substrate, and wherein which of the front and back sides has the first or second conductive feature changes on at least one of the levels.

In example 25, the subject matter of any one of examples 21 to 24 wherein the conductive features of the front side and back side cooperatively have a total surface area, wherein substantially half of the total surface area is roughened.

In example 26, a device, apparatus, or system includes means to perform a method according to any one of the above implementations.

In example 27, at least one machine readable medium includes a plurality of instructions that in response to being executed on a computing device, cause the computing device to perform a method according to any one of the above implementations.

It will be recognized that the disclosures herein are not limited to the implementations so described, but can be practiced with modification and alteration without departing from the scope of the appended claims. For example, the above implementations may include specific combination of features. However, the above implementations are not limited in this regard and, in various implementations, the above implementations may include undertaking only a subset of such features, undertaking a different order of such features, undertaking a different combination of such features, and/or undertaking additional features than those features explicitly listed. The scope of the assemblies, devices, and methods disclosed herein should, therefore, be determined with reference to the appended claims, along with the full scope of equivalents to which such claims are entitled.

The invention claimed is:

1. An electronic device package structure, comprising;

a substrate with a first side and a second side opposite the first side;

a first conductive feature on and entirely over the first side, the first conductive feature having a first surface and a first sidewall, the first surface substantially parallel to the first side;

a conformal first dielectric material layer in contact with a first portion of the first surface and the first sidewall, wherein the conformal first dielectric material layer has a first composition comprising silicon and nitrogen;

a first via in contact with a second portion of the first surface;

a second dielectric material in contact with the conformal first dielectric material layer and the first via, wherein the second dielectric material has a second composition comprising a first organic material;

a second conductive feature on and entirely over the second side, the second conductive feature having a second surface and a second sidewall, the second surface substantially parallel to the second side;

a third dielectric material in contact with a first portion of the second surface and the second sidewall, wherein the third dielectric material has the second composition or a third composition comprising a second organic material; and a second via in contact with a second portion of the second surface and the third dielectric material, wherein a surface roughness of the first portion of the second surface is greater than a surface roughness of the first portion of the first surface and greater than a surface roughness of the second portion of the second surface.

2. The electronic device package structure of claim 1, wherein the second dielectric material and the third dielectric material have substantially the same composition.

3. The electronic device package structure of claim 1, wherein the first organic material and/or the second organic material comprise an epoxy resin, an organic polymer, a liquid crystal polymer, a bismaleimide triazine resin, or a polyimide material.

4. The electronic device package structure of claim 1, wherein the first conductive feature and the second conductive feature have substantially the same composition.

5. The electronic device package structure of claim 1, wherein the first conductive feature and the second conductive feature each comprise Cu.

6. The electronic device package structure of claim 1, wherein the first portion of the second surface has an average surface roughness of at least 100 nm, and the first portion of the first surface has an average surface roughness less than 100 nm.

7. The electronic device package structure of claim 1, wherein the first portion of the first surface has an average surface roughness of at least 1 nm, and wherein the first portion of the second surface has an average roughness of at most 600 nm.

8. The electronic device package structure of claim 1, wherein the first portion of the second surface has a surface roughness six times greater than a surface roughness of the first portion of the first surface.

9. The electronic device package structure of claim 1, wherein the first conductive feature is part of a first trace where the thinnest line of the first trace has a width that is at most 50 microns, and the second conductive feature is part of a second trace where the thinnest line of the second trace has a width that is over 50 microns.

10. The electronic device package structure of claim 1, wherein the second conductive feature is a power routing conductive feature.

11. The electronic device package structure of claim 1, wherein the first conductive feature comprises a high speed IO data signal conductor and the second conductive feature comprises a non-high speed IO data signal conductor.

12. The electronic device package structure of claim 1, wherein the substrate comprises multiple levels with the first conductive feature and the second conductive feature, respectively, on opposite sides of the substrate.

13. The electronic device package structure of claim 1, further comprising:

a board; and an asymmetric package coupled to the board, the asymmetric package comprising the substrate, the first conductive feature, the conformal first dielectric material layer, the first via, the second dielectric material, the second conductive feature, the third dielectric material, and the second via.

14. An apparatus, comprising;

a package substrate with a first side and a second side opposite the first side;

a first conductive feature entirely over the first side, the first conductive feature having a first surface and a first sidewall, the first surface substantially parallel to the first side;

a conformal dielectric layer on a first portion of the first surface and on the first sidewall, the conformal dielectric layer comprising silicon and nitrogen;

a first via in contact with a second portion of the first surface;

a first dielectric material on the conformal dielectric layer and on the first via;

a second conductive feature entirely over the second side, the second conductive feature having a second surface and a second sidewall, the second surface substantially parallel to the second side;

a second dielectric material on a first portion of the second surface and on the second sidewall, the first dielectric material and the second dielectric material comprising an organic material or a ceramic material; and a second via in contact with a second portion of the second surface and on the second dielectric material, wherein a surface roughness of the first portion of the second surface is greater than a surface roughness of the first portion of the first surface and greater than a surface roughness of the second portion of the second surface.

15. The apparatus of claim 14, wherein the first dielectric material and the second dielectric material have substantially the same composition.

16. The apparatus of claim 14, wherein the first dielectric material and/or the second dielectric material comprise an epoxy resin, an organic polymer, a liquid crystal polymer, a bismaleimide triazine resin, or a polyimide material.

17. The apparatus of claim 14, wherein the first conductive feature and the second conductive feature have substantially the same composition.

18. The apparatus of claim 14, wherein the first conductive feature and the second conductive feature each comprise Cu.

19. The apparatus of claim 14, wherein the first portion of the second surface has an average surface roughness of at least 100 nm, and the first portion of the first surface has an average surface roughness less than 100 nm.

20. The apparatus of claim 14, wherein the first portion of the first surface has an average surface roughness of at least 1 nm, and wherein the first portion of the second surface has an average roughness of at most 600 nm.

21. The apparatus of claim 14, wherein the first portion of the second surface has a surface roughness six times greater than a surface roughness of the first portion of the first surface.

22. The apparatus of claim 14, wherein the first conductive feature is part of a first trace where the thinnest line of the first trace has a width that is at most 50 microns, and the second conductive feature is part of a second trace where the thinnest line of the second trace has a width that is over 50 microns.

23. The apparatus of claim 14, wherein the second conductive feature is a power routing conductive feature.

24. The apparatus of claim 14, wherein the first conductive feature comprises a high speed IO data signal conductor and the second conductive feature comprises a non-high speed IO data signal conductor.

25. The apparatus of claim 14, further comprising:

a board; and an asymmetric package coupled to the board, the asymmetric package comprising the package substrate, the first conductive feature, the conformal dielectric layer, the first via, the first dielectric material, the second conductive feature, the second dielectric material, and the second via.

* * * * *